United States Patent
Brodoceanu

(10) Patent No.: US 10,998,215 B2
(45) Date of Patent: May 4, 2021

(54) MONITORING DRY-ETCHING OF POLYMER LAYER FOR TRANSFERRING SEMICONDUCTOR DEVICES

(71) Applicant: Facebook Technologies, LLC, Menlo Park, CA (US)

(72) Inventor: Daniel Brodoceanu, Saarbrucken (DE)

(73) Assignee: Facebook Technologies, LLC, Menlo Park, CA (US)

( * ) Notice: Subject to any disclaimer, the term of this patent is extended or adjusted under 35 U.S.C. 154(b) by 430 days.

(21) Appl. No.: 16/020,775

(22) Filed: Jun. 27, 2018

(65) Prior Publication Data

US 2020/0006108 A1 Jan. 2, 2020

(51) Int. Cl.
| | |
|---|---|
| *H05K 3/30* | (2006.01) |
| *H01L 21/68* | (2006.01) |
| *H01L 27/15* | (2006.01) |
| *H05K 3/00* | (2006.01) |
| *H01L 21/683* | (2006.01) |

(52) U.S. Cl.
CPC ........ *H01L 21/681* (2013.01); *H01L 21/6835* (2013.01); *H01L 27/156* (2013.01); *H05K 3/0026* (2013.01); *G05B 2219/45063* (2013.01); *H01L 2221/68381* (2013.01)

(58) Field of Classification Search
CPC . H01L 21/681; H01L 27/156; H01L 21/6835; H01L 2221/68381; H01L 21/67069; H01L 21/67253; H05K 3/0026; H05K 2203/016; H05K 3/007; G05B 2219/45063; Y10T 29/4913
USPC .......................................................... 29/832
See application file for complete search history.

(56) References Cited

U.S. PATENT DOCUMENTS

| | | | |
|---|---|---|---|
| 5,423,931 A * | 6/1995 | Inoue ................. | H05K 13/0486 29/762 |
| 5,450,205 A * | 9/1995 | Sawin ................ | G01B 11/0675 216/60 |
| 6,270,622 B1 | 8/2001 | Klippert et al. | |

(Continued)

FOREIGN PATENT DOCUMENTS

| | | |
|---|---|---|
| WO | WO-2016/060676 A1 | 4/2016 |
| WO | WO-2017/037475 A1 | 3/2017 |

OTHER PUBLICATIONS

PCT International Search Report and Written Opinion, PCT Application No. PCT/US2018/045672, dated Mar. 25, 2019, 12 pages.

(Continued)

*Primary Examiner* — Donghai D Nguyen
(74) *Attorney, Agent, or Firm* — Fenwick & West LLP

(57) ABSTRACT

Embodiments relate to placing light emitting diodes from a carrier substrate to a target substrate. At least one LED is embedded in a polymer layer on a substrate. The polymer layer is etched between the at least one LED and the substrate. A thickness of the polymer layer is monitored during etching of the polymer layer. The etching of the polymer layer is terminated responsive to determining that the thickness of the polymer layer is in a target range or a target value. A pick-up-tool (PUT) is brought into contact with at least one surface of the at least one LED facing away from the substrate responsive to dry-etching the polymer layer, and the PUT is lifted with the at least one LED attached to the PUT.

17 Claims, 7 Drawing Sheets

(56) References Cited

U.S. PATENT DOCUMENTS

| | | |
|---|---|---|
| 9,217,541 B2 * | 12/2015 | Bathurst ............... B81C 99/002 |
| 2015/0028362 A1 | 1/2015 | Chan et al. |
| 2016/0027834 A1 | 1/2016 | De Graff et al. |
| 2016/0086855 A1 | 3/2016 | Bower et al. |
| 2017/0162552 A1 | 6/2017 | Thompson |
| 2017/0278733 A1 | 9/2017 | Chang et al. |
| 2018/0166429 A1 | 6/2018 | Chong et al. |

OTHER PUBLICATIONS

Extended European Search Report, European Patent Office, European Patent Application No. 19151200.3, Jul. 11, 2019, 7 pages.

* cited by examiner

MONITORING DRY-ETCHING OF POLYMER LAYER FOR TRANSFERRING SEMICONDUCTOR DEVICES

BACKGROUND

Field of the Disclosure

The present disclosure relates to strategies for transferring semiconductor devices from a carrier substrate to a target substrate, and in particular to performing monitored treatment on a polymer layer for securing the semiconductor devices onto the carrier substrate before transfer of the semiconductor devices from the carrier substrate to the target substrate.

Discussion of the Related Art

To populate a display with very small light emitting diodes (LEDs), such as micro-LEDs (µLED), the LEDs may be transferred from a carrier substrate on which they were manufactured or placed for processing to a final target substrate that forms part of a display, or "display substrate." Such small semiconductor devices may be assembled with a defined separation distance between them or closely packed together on the target substrate. Because of the small size of these devices, conventional pick-and-place techniques are unsuitable.

Many modifications have been proposed for improving pick-and-place of µLEDs. One strategy is to transfer semiconductor devices from their native substrates on which they are manufactured to a carrier substrate that includes a polymer layer. The polymer layer helps secure the semiconductor devices to the carrier substrate. However, a pick-and-place process relies on a Van der Waals or other adhesive force that forms between a pick up head and a pick up surface of the semiconductors. While the polymer layer helps secure and stabilize the semiconductors to the carrier substrate, it may prevent a pick up head from removing the semiconductor from the carrier substrate, since the Van der Waals or other adhesive force may not be strong enough to pull the semiconductor from the polymer layer. Conventional techniques for remedying this include heating the polymer layer above its glass transition temperature. However, this often results in damage to the semiconductors from the applied heat, as well as the formation of thin polymer threads from the polymer layer that travel with the semiconductor device when they are picked from the melted polymer layer. Both of these drawbacks result in lower semiconductor yield, and may inhibit bonding of the semiconductor devices to the target substrate.

SUMMARY

Embodiments relate to placing light emitting diodes from a carrier substrate to a target substrate. At least one LED is embedded in a polymer layer on a substrate. The polymer layer is etched between the at least one LED and the substrate. A thickness of the polymer layer is monitored during etching of the polymer layer. The etching of the polymer layer is terminated responsive to determining that the thickness of the polymer layer is in a target range or a target value. A pick-up-tool (PUT) is brought into contact with at least one surface of the at least one LED facing away from the substrate responsive to dry-etching the polymer layer, and the PUT is lifted with the at least one LED attached to the PUT.

BRIEF DESCRIPTION OF THE DRAWINGS

Figure (FIG. 1 is schematic diagram illustrating a display assembly system, according to one embodiment.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digit of each reference number corresponds to the figure in which the reference number is first used.

Embodiments relate to monitoring dry-etching of a polymer layer that secures LEDs onto a carrier substrate before transferring the LEDs from the carrier substrate to a target substrate. The polymer layer secures LEDs to the carrier substrate, such that the polymer layer stabilizes and prevents tilting of the LEDs as they are moved or otherwise prepared for a pick-and-place process. To pick up the LEDs with a pick-up-head tool, the polymer layer is dry-etched to reduce the thickness of the polymer layer and allow the LEDs to be removed from the carrier substrate. During dry-etching, a thickness of the polymer layer is visually monitored, and dry-etching is terminated when the thickness of the polymer layer reaches a target range or a target value. The target thickness or target value is a thickness of the polymer layer that allows the LEDs to be removed from the polymer layer, while continuing to stabilize the LEDs. Visually monitoring the polymer layer thickness allows for more precise control over the polymer layer during dry-etching, since etching behavior is dependent on many different variables (such as plasma power, gas pressure, temperature, etc.) and it is difficult to reach a target thickness based solely on etching time. A remaining polymer layer that is left after the dry-etching further helps stabilize the LEDs during the pick-and-place process itself and may prevent tilting of the LED pick-up surface.

Figure 1:
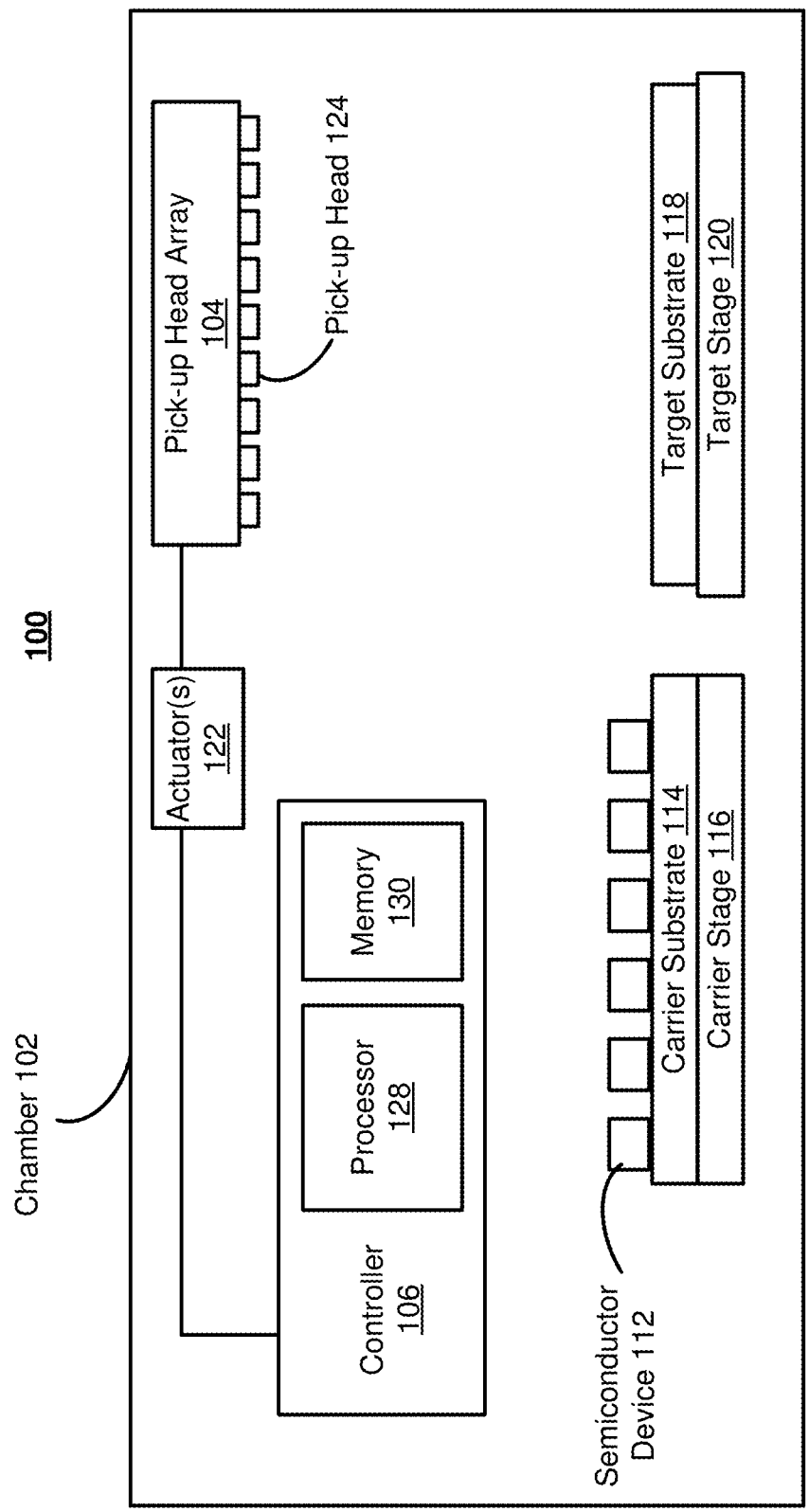

FIG. 1 is schematic diagram illustrating a display assembly system 100, according to one embodiment. The system 100 fabricates a display device through a pick-and-place technique, which may be carried out within a chamber 102. Specifically, the system 100 assembles semiconductor devices 112 by picking up micro-LEDs (µLEDs) from a carrier substrate 114 and places them onto a target substrate 118. In some embodiments, the semiconductor devices 112 are light emitting diode (LED) dies that emit different colors.

In some embodiments, the semiconductor devices 112 are different color µLEDs having a reduced divergence of light output and a small light emitting area. The carrier substrate 114 may be a carrier film that holds the semiconductor devices 112 for pick up by the pick-up head array 104. As described herein, the pick-up head array 104 or pick-up head is a PUT. In other embodiments, the carrier substrate 114 is the native substrate on which the semiconductor device 112 is grown. The carrier substrate 114 may be the carrier substrate 206 following monitored dry-etching of a polymer layer, as described in further detail with reference to FIGS. 2-7.

The target substrate 118 may be a display substrate, or may be an intermediate carrier substrate that facilitates bonding with a display substrate. The system 100 places µLEDs at pixel locations of the display substrate, and then bonds the µLEDs to the display substrate.

As shown, the system 100 further includes a pick-up head array 104, an actuator 122, a carrier stage 116, and a target stage 120. The carrier stage 116 holds a carrier substrate 114 having semiconductor devices 112. The target stage 120 holds a target substrate 118 to receive some or all of the semiconductor devices 112 from the carrier substrate 114.

A controller 106 is coupled to the pick-up head array 104 (e.g., via the actuator 122) and controls the operations of the pick-up head array 104. For example, the controller 106 causes the pick-up head array 104 to pick up one or more semiconductor devices 112 located on a carrier substrate 114, and place the one or more semiconductor devices on the target substrate 118. The controller 106 may include, among other components, a memory 130 and a processor 128. The memory 130 stores instructions for operating the pick-up head array 104. The memory 130 may be any memory storage, such as an SRAM, DRAM, ROM, or any other computer memory storage. The processor 128 executes the instructions stored in the memory 130 and sends out the instructions to the pick-up head array 104 via a signal interface (not shown). The processor 128 executes the method described in further detail with reference to FIG. 5.

The pick-up head array 104 includes a plurality of pick-up heads 124. Each pick-up head 124 can pick up a semiconductor device 112 from the carrier substrate 114, and place the semiconductor device on the target substrate 118. After picking up a semiconductor device 112, the pick-up head 124 is aligned with a location on the target substrate 118.

The actuator 122 is an electro-mechanical component that controls the movement of the pick-up head array 104 based on instructions from the controller 106, as executed by the processor 128 from instructions stored in memory 130, and thus controls the transfer of the semiconductor device 112 from carrier substrate 114 and placement on the target substrate 118. For example, the actuator 122 may move the pick-up head array 104, or individual pick-up heads 124, with three degrees of freedom including up and down, left and right, and forward and back. In some embodiments, the pick-up head array 104 has more than three degrees of freedom. For example, the pick-up head array 104 may have six degrees of freedom, allowing for lateral motion up and down, left and right, and forward and back, as well as rotational motion along three different axes. The actuator 122 may be embodied, for example, as a rotating motor, a linear motor or a hydraulic cylinder.

The controller 106 aligns the one or more pick-up heads 124 with the display substrate 118, and places the semiconductor devices 112 attached to the one or more pick-up heads 124 on the display substrate 118.

The system 100 may include one or more carrier substrates 114. For example, different carrier substrates 114 may carry different color LED dies. A carrier substrate 114 may be carrier film that holds singulated semiconductor devices 112 for transfer to the display substrate 118. The system may include one or more target substrates 118. In some embodiments, such as when the target substrate 118 is the display substrate for receiving the semiconductor devices 112, the target stage 120 includes a heater for thermal conductive bonding of the electrical contact pads of the semiconductor devices 112 to the display substrate 118 subsequent to placement of the semiconductor devices 112 on the display substrate 118 by the pick-up head array 104. In other embodiments, the system 100 includes a laser system for laser bonding of the electrical contact pads of the semiconductor devices 112 to the display substrate 118 subsequent to placement of the semiconductor devices 112 on the display substrate 118 by the pick-up head array 104.

In some embodiments, the system 100 includes multiple pick-up head arrays 104 each positioned at a separate station. Each station may be dedicated to the pick-and-place of a particular color LED, such as a green station for green LEDs, a red station for red LEDs, and a blue station for blue LEDs, etc. Different colored LEDs are grown on different native substrates, which may be different carrier substrates 114 as shown in FIG. 1, due to differences in their composition and structure.

When the semiconductor devices 112 are µLEDs, creating enough Van der Waals force between the pick-up surface of the semiconductor devices 112 and the pick-up head 124 is important, since the small surface of the µLEDs reduces the surface area over which the Van der Waals interactions can occur. Furthermore, during movement of the carrier substrate 114, the semiconductor devices 112 are ideally secured, so that when the pick-up head 124 comes into contact with the pick-up surface of the semiconductor devices 112, the two surfaces align and there is minimal tilting of the semiconductor devices 112. Using a polymer layer on the carrier substrate 114 and an etching monitoring system as described in FIGS. 2-7, the pick-and-place technique of system 100 can be used to successfully place µLEDs from the carrier substrate 114 to the target substrate 118.

In some embodiments, the force between the pick-up surface of the semiconductor devices 112 and the pick-up head 124 may be any adhesion force in addition to or other than a Van der Waals force. For example, the pick-up head 124 may include grippers that grip the semiconductor devices 112 and remove them from the carrier substrate 114. In other examples, the pick-up head 124 may pick up semiconductor devices 112 using electrostatic forces.

Figure 2:
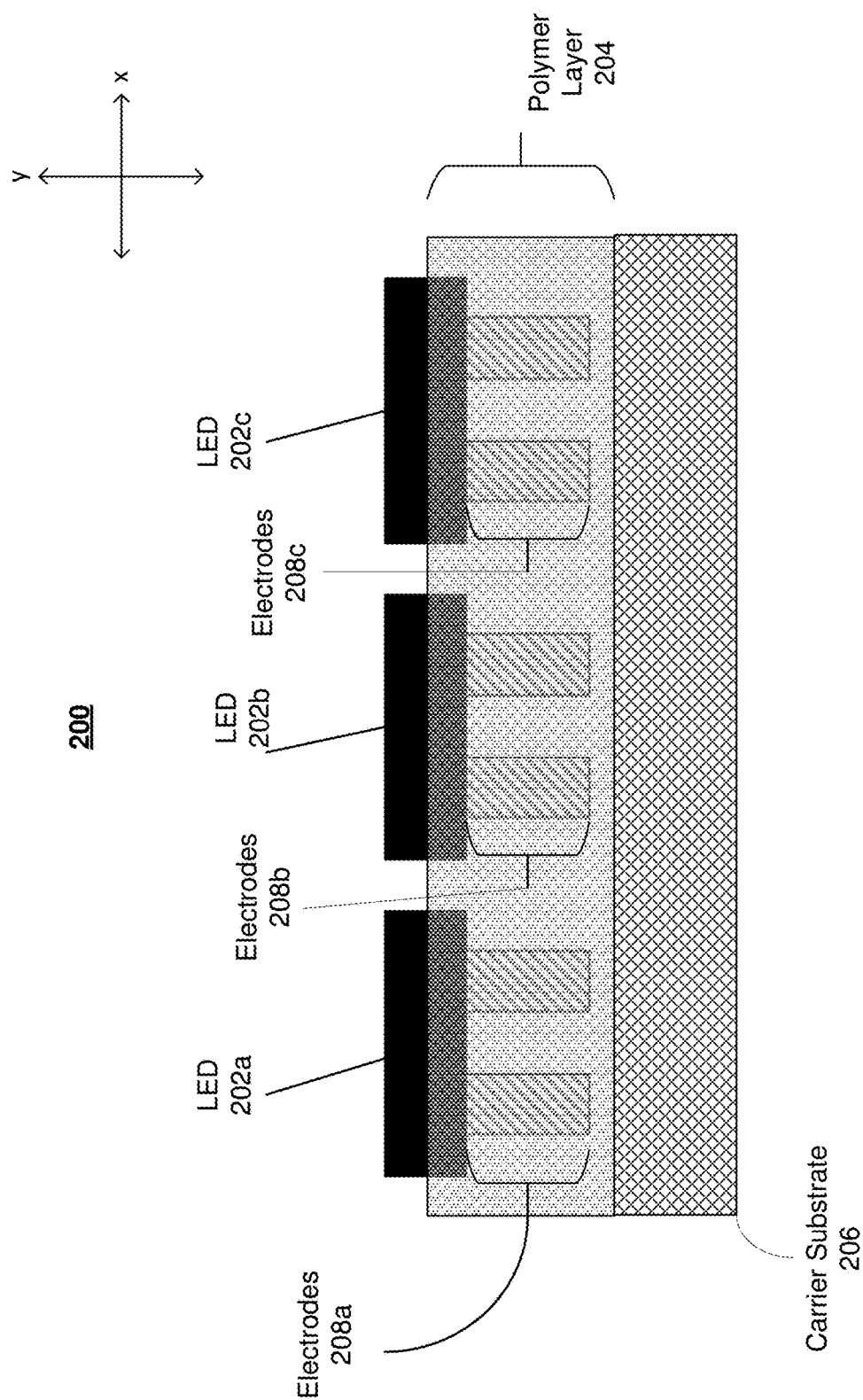
FIG. 2 is a cross sectional diagram of LEDs embedded in a polymer layer, according to one embodiment.

FIG. 2 is a cross sectional diagram 200 of LEDs 202a, 202b and 202c embedded in a polymer layer 204 on a carrier substrate 206, according to one embodiment. The electrodes of the LEDs, electrodes 208a, 208b and 208c (collectively, electrodes 208), are embedded in the polymer layer 204. The polymer layer 204 is etched in an etching monitoring system, such as the etching monitoring system 300 as described in further detail with reference to FIG. 3, before being removed from the carrier substrate 206 for use in a pick-and-place process, such as the display assembly system 100 as described in further detail with reference to FIG. 3.

The LEDs 202a, 202b and 202c (collectively, LEDs 202) may be µLEDs. The top of the LEDs 202 have a pick-up surface that comes in contact with a pick-up head, such as the pick-up head 124. The pick-up surface of the LEDs 202 is a surface of the LEDs 202 opposite or facing away from the carrier substrate 206. As shown in FIG. 2, there are three LEDs on the carrier substrate 206. However, there may be any number of LEDs transferred on the carrier substrate 206. As shown in FIG. 2, the LEDs 202 have a single layer, however the LEDs 202 may have any number of layers and/or internal structures (not shown). In some examples, the LEDs 202 may be grown on a separate native substrate (not shown) and the carrier substrate 206 is an intermediate substrate used to transfer the LEDs 202 for use in the pick-and-place technique of system 100. The separate native substrate may be a sapphire, GaN, GaAs, SiC, glass, or any other standard semiconductor substrate material. As shown in FIG. 2, the full semiconductor layer of LEDs 202 is not embedded in the polymer layer 204. However, the polymer layer 204 may have any desired thickness, such that the semiconductor layer of LEDs may be fully imbedded in the polymer layer 204. The LEDs 202 may be the semiconductor device 112 as shown in FIG. 1.

The electrodes 208 may be formed from any conductive material. Electrodes 208 are bonded to a target substrate, such as the target substrate 118, following removal of the LEDs from the carrier substrate 206 through a pick-and-place technique. Thus a conductive interface forms between the electrodes 208 and a target substrate, through which the LEDs 202 may be powered.

The polymer layer 204 may be formed from any polymer capable of being dry-etched. In some examples, the polymer layer 204 may be formed from polyvinyl alcohol (PVA), polyvinyl acetate (PVAC), polyester, polymethyl methacrylate (PMMA), polystyrene (PS), polycarbonate (PC), polyvinyl butyral (PVB), or any photoresist material used in a conventional lithography process. In other examples, the polymer layer 204 may be formed from any polymer material. The polymer layer 204 secures the LEDs 202 as they are moved with the carrier substrate 206 during the pick-and-place technique of system 100. The polymer layer 204 may be thicker than the height of the electrodes 208. In some examples, the polymer layer 204 may have a thickness less than the electrodes 208. In some examples, the polymer layer 204 is between 3 and 10 µm thick. The polymer layer 204 may be epitaxially grown on the carrier substrate 206 following placement of the LEDs 202 on the carrier substrate 206. For example, the polymer layer 204 may be grown using Molecular Beam Epitaxy (MBE) or Metalorganic Chemical Vapor Deposition (MOCVD). As shown in FIG. 2, the polymer layer is a single layer, however in other examples, the polymer layer 204 may be formed from any number of layers of any number of polymer materials.

The carrier substrate 206 may be glass, silicon, or any other suitable material. The carrier substrate 206 is the carrier substrate 114 as shown in FIG. 1, and is used to move the LEDs 202 during the pick-and-place operation of system 100.

With the polymer layer 204, the LEDs 202 are secured on the carrier substrate 206, reducing lateral shifting or tilt when the LEDs 202 come in contact with a pick-up-head during a pick-and-place technique of system 100, such as the pick-up head 124.

In some examples, one or more additional layers of non-semiconductor material may be formed over the surface of the LEDs 202. These additional layers may be used to adhere to a surface of the pick-up head 124, and thus facilitate the removal of the LEDs 202 from the carrier substrate 206. For example, the additional layer may be a conformable interface layer (clayer) formed from a conformable material that allows the LEDs 202 to be adhesively attached to the pick-up head 124. The polymer layer 204 may be partially removed before the LEDs 202 are placed from the carrier substrate 206 to a target substrate using a pick and place process and a pick-up head 124 in the display assembly system 100 using the etching monitoring system 300 as described below.

Figure 3:
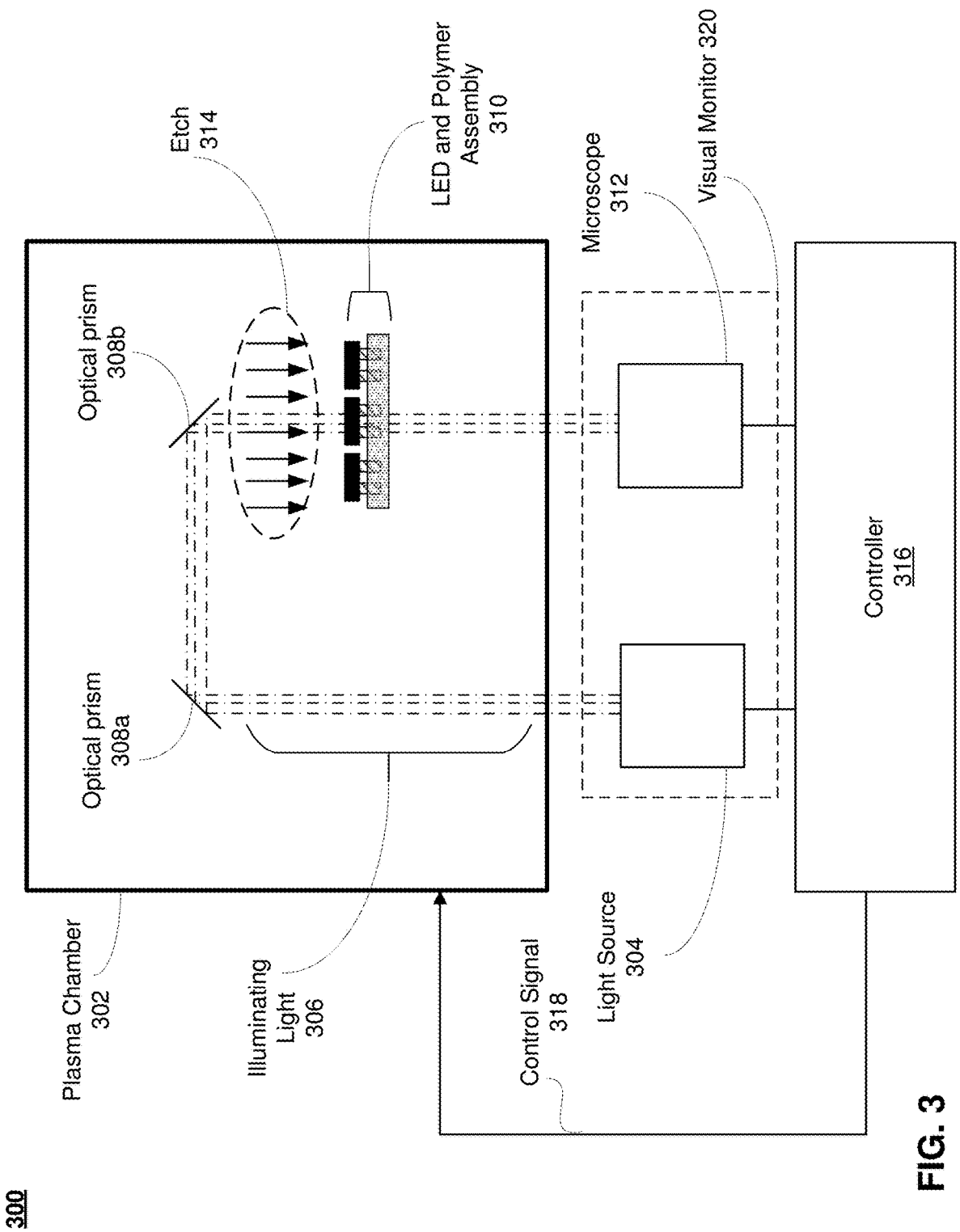
FIG. 3 is a block diagram of an etching monitoring system, according to one embodiment.

FIG. 3 is a block diagram of an etching monitoring system 300, according to one embodiment. The etching monitoring system 300 determines a thickness of a polymer layer in which LEDs are embedded during etching of the polymer layer. The etching monitoring system 300 terminates etching of the polymer layer when the thickness of a polymer layer reaches a target range or is substantially at a target value.

Etching of a polymer layer is conducted within a plasma chamber 302. The plasma chamber 302 may be external to the chamber 102 as shown in FIG. 1. In some examples, the plasma chamber 302 may be located within the chamber 102. The plasma chamber 302 may be maintained at a partial vacuum. Plasma is formed within the plasma chamber 302 and used to etch an LED and polymer assembly 310. The LED and polymer assembly 310 is a structure of LEDs embedded in a polymer layer, such as the LEDs 202 in the polymer layer 204 on a carrier substrate 206 as described in further detail with reference to FIG. 2.

The etching monitoring system 300 produces a plasma that etches 314 the LED and polymer assembly 310. The etch 314 may be a dry-etch. The etch 314 etches a polymer layer, such as the polymer layer 204 of the LED and polymer assembly 310. The etch 314 etches a polymer layer without affecting the semiconductor structure of the LED and polymer assembly 310. In some examples, a mask layer may be added to a surface of the LEDs exposed to the etch 314, such as a layer of a photo-resist material on top of the LEDs 202 as shown in FIG. 2 or any other standard masking material. The mask layer may further ensure that the semiconductor structure of the LEDs is not affected by the etch 314. In some examples, the etch 314 may be an isotropic etching, such that the removal of the polymer layer 204 is multi-directional. In some examples, the etch 314 under-etches the polymer layer beneath a mask layer. Under-etching is described in further detail with reference to FIG. 5. In some examples, the etch 314 under-etches the polymer layer beneath a semiconducting layer of the LEDs. The etch 314 may be an oxygen dry-etch, such that the plasma chamber 302 is a Radio Frequency (RF) oxygen plasma reactor. The etch 314 may dry-etch a polymer surface of the semiconductor device 112 with any gas that selectively removes a polymer without affecting the semiconductor structure of the semiconductor device 112. For example, the dry-etcher may use air plasma or ammonia ($NH_3$) gas. The plasma chamber 302 may include gas intake and gas out-take valves, ionizing plates, and any other standard dry-etching components.

The progress of the etch 314 is monitored by a visual monitor 320, which is composed of a light source 304 and a microscope 312. The visual monitor 320 is in signal communication with a controller 316 through the control signal 318. The visual monitor 320 produces an image or other visual information of a thickness of a polymer layer of the LED and polymer assembly 310 as the thickness of the polymer layer of the LED and polymer assembly 310 changes in response to the etch 314. The visual monitor 320 conveys this visual information to the controller 316. The visual monitor 320 may provide continuous visual monitoring of the thickness of a polymer layer of the LED an polymer assembly 310 during the etch 314, such that the LED and polymer assembly 310 need not be removed from the plasma chamber 302 to determine a thickness of the polymer layer. In some embodiments, the total time of the etch 314 may be different for different LED and polymer assemblies 310, however the target thickness and target value of the polymer layer may be the same. The visual monitor 320 allows the etch 314 to achieve the same target thickness or target value of the polymer layer under variable etch conditions.

The light source 304 may be any standard collimated light source used in light microscopy. In some examples, the light source 304 may emit light with a wavelength between 365 nm and 800 nm. The light source 304 may emit light with a wavelength above an absorption wavelength of a carrier substrate of the LED and polymer assembly 310, such as the carrier substrate 206. For example, if the carrier substrate of the LED and polymer assembly 310 is formed in whole or in part from a GaN material, then the light source 304 may emit light with a wavelength above 360 nm. If the carrier substrate of the LED and polymer assembly 310 is formed in whole or in part from a GaAs material, then the light source 304 may emit light with a wavelength above 630 nm. In some examples, the light source 304 may emit light at an absorption wavelength of a polymer layer of the LED and polymer assembly 310. In some examples, the light source 304 may be a UV LED. The light source 304 emits illuminating light 306 into the plasma chamber 302. The illuminating light 306 reflects off of optical prism 308a and optical prism 308b (collectively optical prisms 308). The optical prisms 308 may be right angle prisms as shown in FIG. 300, or any other optical prisms that re-direct the illuminating light 306 from the light source 304 through the LED and polymer assembly 310 in the direction shown in FIG. 3. The LED and polymer assembly 310 may be vertically mounted within the plasma chamber 302, such that illuminating light 306 passes from the optical prism 308b to the microscope 312 along the y axis from the LEDs 202 to the carrier substrate 206, as shown in FIG. 2. Thus the visual image of the LED and polymer assembly 310 is of the LED and polymer assembly 310 as viewed within the x-z plane, as indicated in the orientation of the LEDs 202 and polymer layer 204 shown in FIG. 2. As shown in FIG. 3, the LED and polymer assembly 310 is illuminated by the light source 304 by light traveling in a direction from the LEDs 202 to the carrier substrate 206. Thus the LED and polymer assembly 310 is illuminated from the direction of the LEDs 202. In other embodiments, the LED and polymer assembly 310 is illuminated by the light source 304 by light traveling in a direction from the carrier substrate 206 to the LEDs 202. Thus the LED and polymer assembly 310 may be oriented within the plasma chamber 302 such that the LEDs 202 are closest to the microscope 312 and the carrier substrate 206 is closest to the optical prism 308b. In these embodiments, the LED and polymer assembly 310 is illuminated from the direction of the carrier substrate 206. In some examples, the microscope 312 may determine the total transmission of light through the LED and polymer assembly 310, and use this measurement in addition to the visual information provided by the microscope 312 to determine a thickness of a polymer layer of the LED and polymer assembly 310. For example, as the microscope 312 may detect that a total transmission of light through the LED and polymer assembly 310 increases as the thickness of a polymer layer decreases as a result of the etch 314.

The microscope 312 provides visual information of the LED and polymer assembly 310 during an etch 314. The microscope 312 communicates this visual information to a controller 316, which is described in further detail with reference to FIG. 4. The controller 316 uses the visual information provided by the microscope and any number of other sensors in the plasma chamber 302 to determine when to terminate the etch 314. The controller 316 provides feedback to the plasma chamber 302 through the control signal 318. The control signal 318 may provide an OFF signal to the plasma chamber 302 that ends the etch 314 when the thickness of the polymer layer reaches a target range or target value. The target range or target value is described in further detail with reference to FIG. 5. In some examples, the microscope 312 may be a scanning electron microscope (SEM). In these embodiments, the light source 304 may instead be an electron source, and the etch 314 may be a RF isotropic dry-etch. Additionally, the SEM detects backscattered electrons (BSE).

Figure 4:
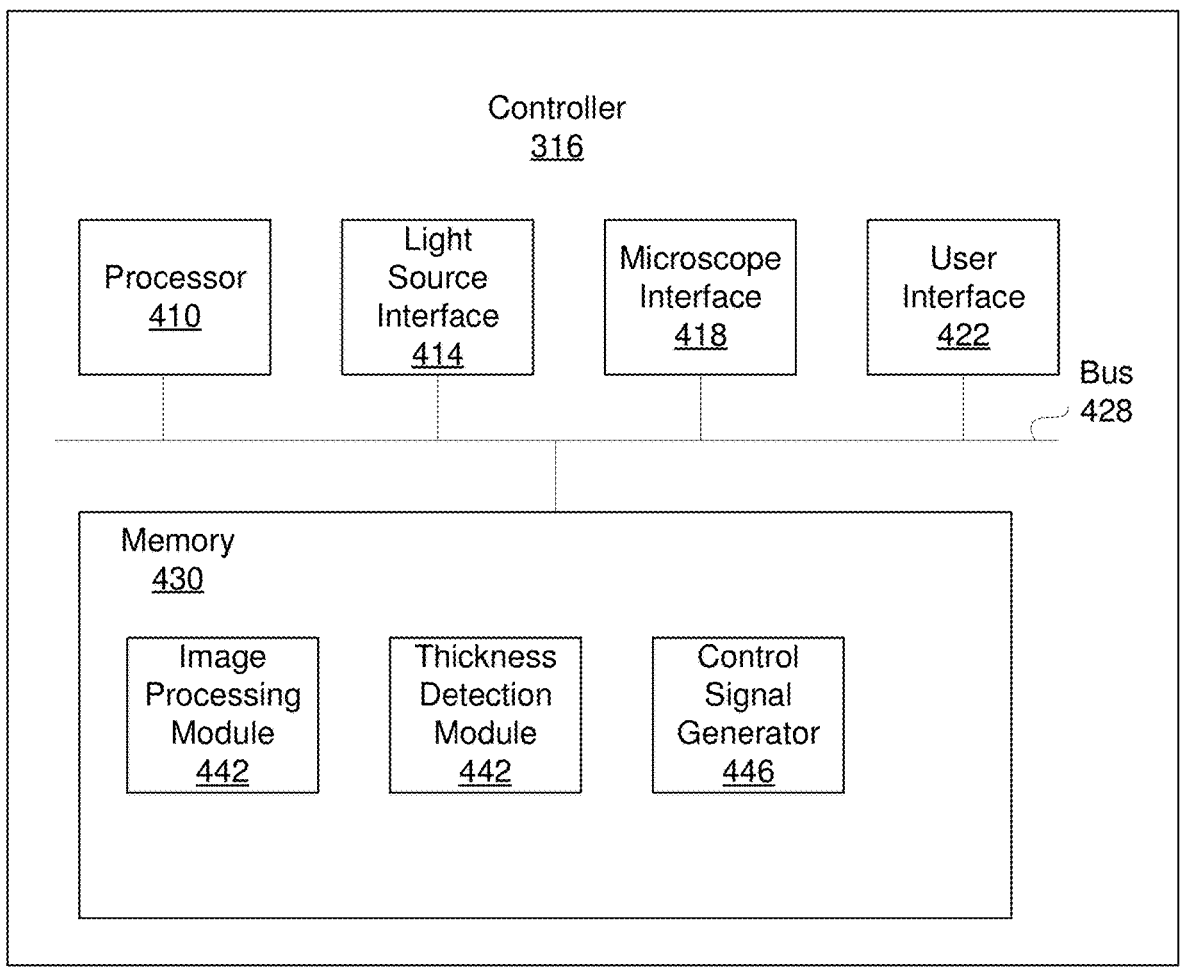
FIG. 4 is a diagram of an etching controller, according to one embodiment.

FIG. 4 is a diagram 400 of an etching controller 316, according to one embodiment. The etching controller 316 provides a controlling interface between the visual monitor 320 and the plasma chamber 302, which are described in further detail with reference to FIG. 3. The etching controller 316 provides a control signal 318 to the plasma chamber 302 that may begin or end dry-etching of a LED and polymer assembly 310.

The etching controller 316 includes a processor 410, a light source interface 414, a microscope interface 418, a user interface 422, and a memory 430. The processor 410, light source interface 414, microscope interface 418 and user interface 422 and/or memory 430 may communicate with each other via the bus 428. The processor 410 may be any standard processor or computing device. The processor 410 may be configured to carry out the method described in further detail with reference to FIG. 7. The light source interface 414 provides a control signal to the light source 304 described in further detail with reference to FIG. 3. The light source interface 414 may provide an ON signal to the light source 304 during etching and monitoring of an LED and polymer assembly, such as the LED and polymer assembly 310. The light source interface 414 may provide an OFF signal to the light source 304 when the etching is terminated and the thickness of a polymer layer need not be monitored. The microscope interface 418 provides a control signal to the microscope 312, which is described in further detail with reference to FIG. 3. The microscope interface 418 may receive visual information from the microscope 312 and convey it to the processor 410 via the bus 428. The processor 410 may use the visual information provided by the microscope interface 418 to determine if a thickness of a polymer layer has reached a target range or target value.

The etching controller 316 additionally includes a user interface 422. The user interface 422 may provide an input/output (I/O) interface to a user, such as indicating to a user that a LED and polymer layer assembly is being etched, or an indication that the polymer layer has reached a target range or target value. The user interface 422 may allow a user to manually control the etching process, such as requesting that dry-etching continue after the polymer layer has reached a target range or target value, or requesting that dry-etching end before the polymer layer has reached a target range or target value. The user interface may convey any user input to the processor 410 via the bus 428.

The etching controller 316 further includes a memory 430, which may store an image processing module 442, a thickness detection module 442 and a control signal generator 446. The image processing module 442 may process and store images received by the microscope interface 418. The image processing module 442 may include instructions for how to process images received by the microscope interface 418. For example, the image processing module 442 may increase the contrast of an image received from the microscope interface 418. The thickness detection module 442 may include instructions for how to determine a thickness of a polymer layer from an image received by the microscope interface 418. For example, the thickness detection module 442 may compare images received from the microscope interface 418 to past successful etches. The thickness detection module 442 is configured to identify a polymer ridge formation of the polymer layer. The polymer ridge formation is described in further detail with reference to FIG. 5. In some embodiments, the thickness detection module may determine a thickness of a polymer layer by determining a transparency of the LED and polymer assembly 310. The thickness detection module 442 may include a calibration file which compares a thickness of a polymer layer with a transmission of light through the LED and polymer assembly 310. In some examples, the thickness detection module 442 may determine areas within an image received from the microscope interface 418 that correspond to etched polymer regions by setting a threshold pixel intensity. For pixels above the threshold pixel intensity, a polymer layer may be etched to a thickness that allows sufficient light transmission through a LED and polymer assembly, such as the LED and polymer assembly 310. For pixels below a threshold pixel intensity, a polymer layer may be too thick to allow for sufficient light transmission through a LED and polymer assembly. In some examples, the thickness detection module may determine a minimum area of regions of pixel intensities above a threshold before a LED and polymer assembly is fully etched. In some examples, the thickness detection module 442 compares an initial image of a LED and polymer assembly before etching to subsequent images of the LED and polymer assembly during an etching process. This may be used to determine a thickness of a polymer layer.

The memory 430 further includes a control signal generator 446. The control signal generator 446 produces an output control signal 318 that is conveyed to the plasma chamber 302 from the controller 316. The control signal generator 446 uses any of the thickness determinations made by the image processing module 442, the thickness detection module and/or the processor 410. The control signal generator 446 produces a control signal 318 which may be used to begin or end the etch 314. For example, if the processor 410 determines that a polymer layer of an LED and polymer assembly 310 has reached a target thickness or target range, the control signal generator 446 may produce a control signal 318 that ends the etch 314.

Figure 5:
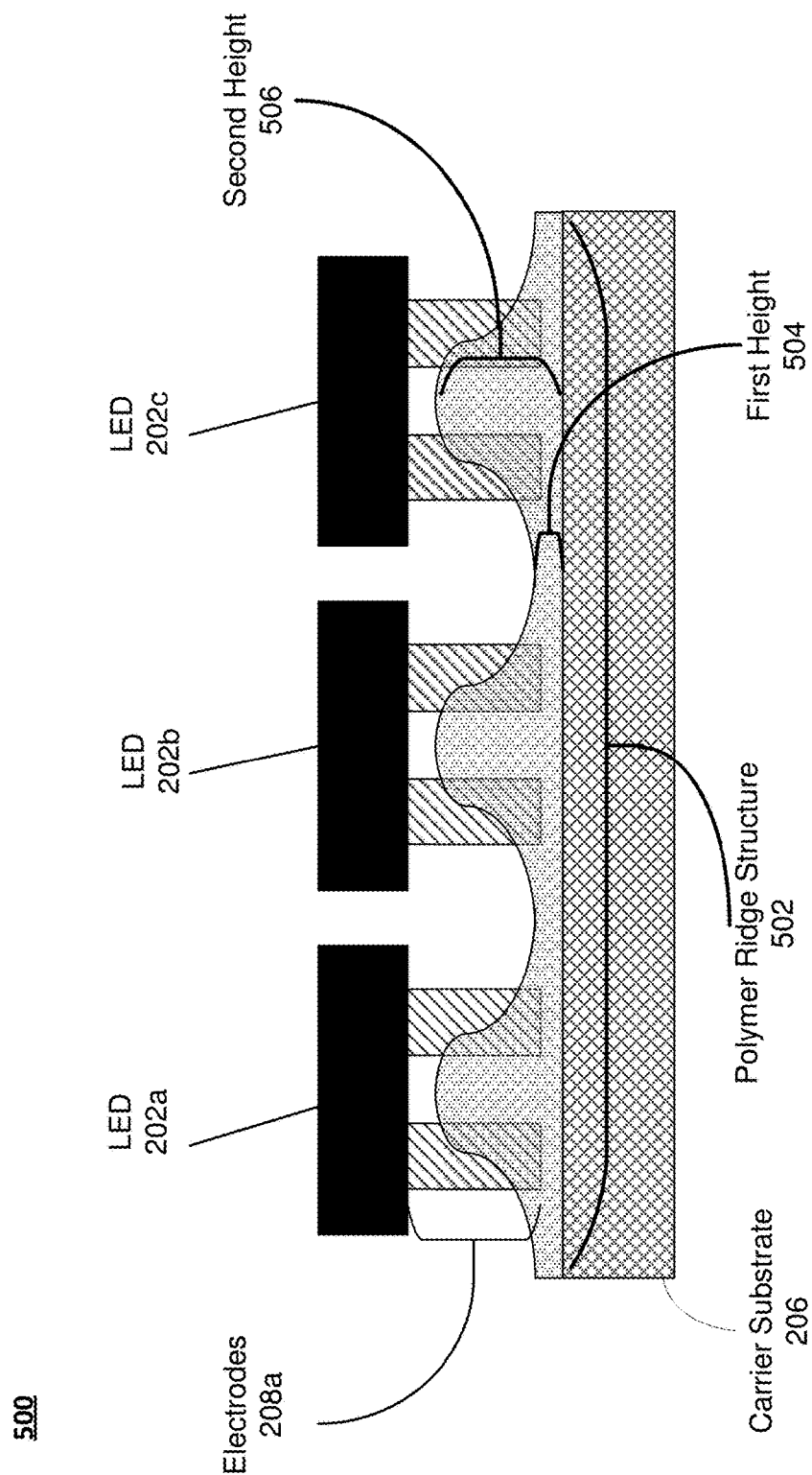
FIG. 5 is a cross sectional diagram of LEDs embedded in an etched polymer layer, according to one embodiment.

FIG. 5 is a cross sectional diagram 500 of LEDs embedded in an etched polymer layer, according to one embodiment. The cross sectional diagram 500 may be the result of the etch 314 as described above. The cross sectional diagram 500 shows a target thickness or target range of a polymer layer. The target thickness or target range of the polymer layer may allow for the removal of the LEDs 202 from the carrier substrate 206 to a target substrate in a pick-and-place system, such as the system 100 and target substrate 118.

The controller 316 allows for the etch 314 to remove the polymer layer until the polymer layer forms the polymer ridge structure 502. The polymer ridge structure 502 may be the target value or target range of the polymer layer. The polymer ridge structure 502 may be a thickness profile of an etched polymer layer. The polymer ridge structure 502 forms as a result of an under-etch of the polymer layer. The polymer layer is thus un-evenly etched during the etch 314, such that an etch directed to the polymer layer between LEDs 202 also under-etches the polymer layer under the LEDs 202. The resulting polymer ridge structure 502 has a first height 504 between the LEDs where the polymer layer is more directly exposed to an etch 314, and a second height 506 underneath the LEDs 202 that is the result of an under-etch. The first height 504 is less than the second height 506. Thus the polymer ridge structure 502 may have more than one target value, which may be the first height 504 and the second height 506. The polymer ridge structure 502 may thus have a target range, of which the first height 504 is the minimum and the second height 506 is the maximum.

The polymer ridge structure 502 may be a thickness that occurs before an onset of a delamination process, in which the LEDs 202 become delaminated from the polymer layer and the carrier substrate 206. The onset of a delamination process is a good indicator of the readiness of the LEDs 2002 to be removed from the carrier substrate 206 through a pick-and-place process. Thus the polymer ridge structure 502 forms before the LEDs 202 delaminate, and allows for continued adhesion of the LEDs to the polymer layer and carrier substrate 206, but with a minimum adhesive force between the LEDs 202 and the polymer layer. This may prevent the LEDs 202 from becoming dislodged from the carrier substrate during a pick-and-place process.

Figure 6:
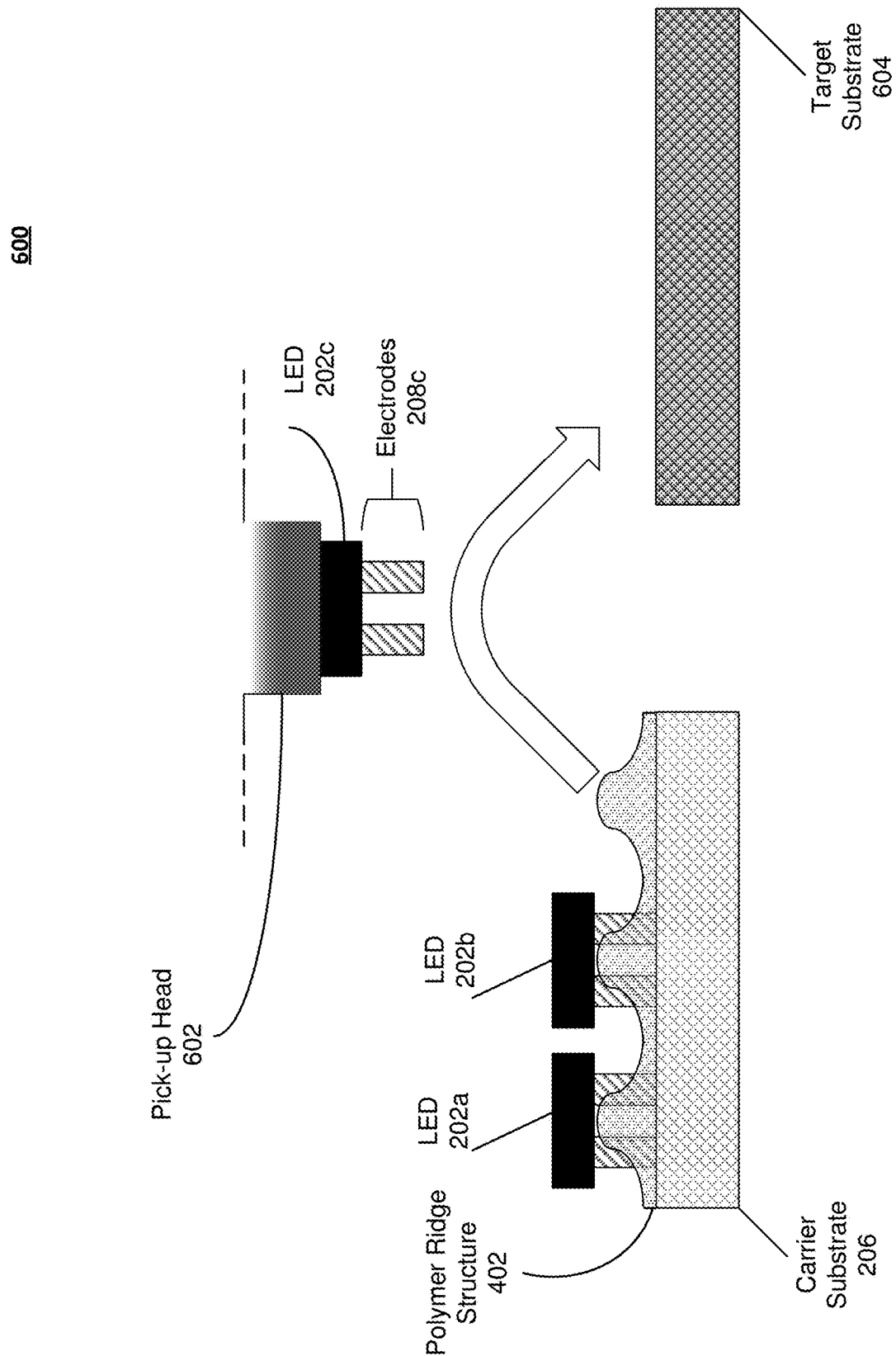
FIG. 6 is a diagram of the placement of LEDs onto a target substrate following etching of a polymer layer and the formation of a polymer ridge structure, according to one embodiment.

FIG. 6 is a diagram 600 of the placement of LEDs onto a target substrate 604 following etching of a polymer layer and the formation of the polymer ridge structure 402, according to one embodiment. FIG. 6 shows a process of transferring LEDs from a carrier substrate to a target substrate using the structure formed through oxygen etching of the structure shown in cross section 200 of FIG. 2. The operation of FIG. 6 may be performed by the pick-up head array 104 of system 100, and is described above in further detail with reference to FIG. 1. The oxygen etching shown in FIG. 3 results in the polymer ridge structure 502 shown in FIG. 5. The LEDs 202 are moved from the carrier substrate 206 to a target substrate 604 with a pick-up head 602.

The pick-up head 602 comes into contact with a pick-up surface of LED 202c. A contact force, such as a Van der Waals force, forms between the pick-up surface of LED 202c and the pick-up head 602. The pick-up head is then lifted away from the carrier substrate 206. The LED 202c is removed from the polymer ridge structure 402 and the carrier substrate 206. The pick-up head 602 may then be maneuvered, with the LED 202c attached to the pick-up head 602, to a desired bonding position on the target substrate 604. The electrodes 208c are placed in contact with the surface of the target substrate 604. The electrodes 208c are then bonded to the surface of the target substrate 604, forming a conductive interface between the electrodes 208c and the target substrate 604. The bond between the electrodes 208c and the target substrate 604 may be formed through heating of the target substrate, or any other standard bonding technique, such as thermocompression bonding.

Any of the LEDs 202 located on the carrier substrate 206 may be selected by a pick-up head 602 for placement on the target substrate 604. For example, LED 202a may be removed from the remaining polymer layer 306 and the carrier substrate 206 and bonded to the target substrate 604.

Figure 7:
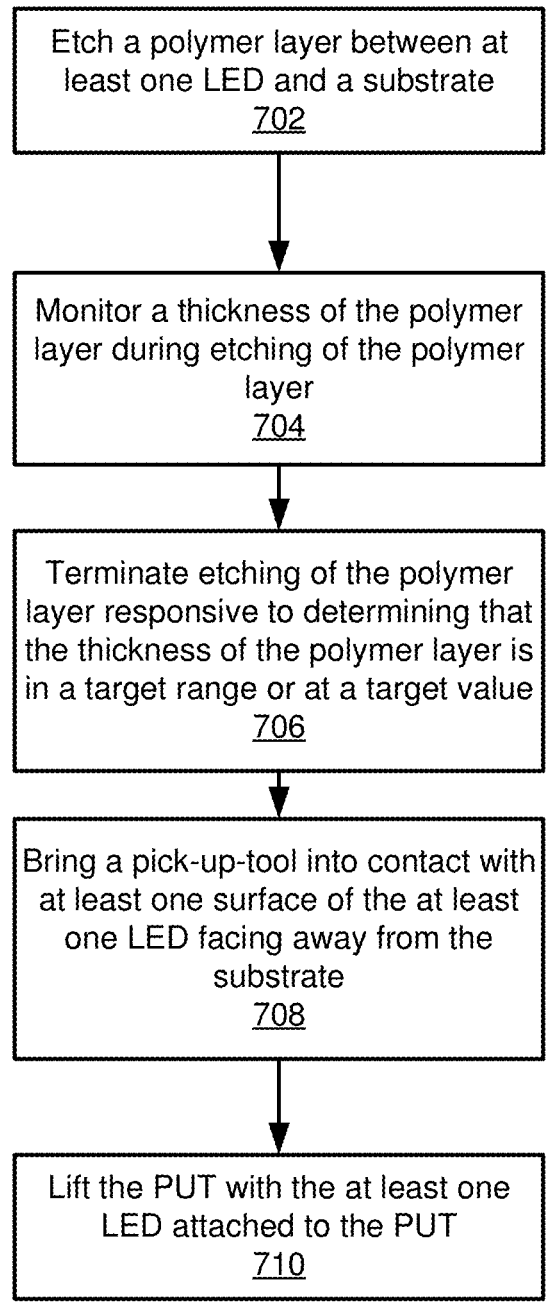
FIG. 7 is a flowchart of a method of transferring LEDs, according to one embodiment.

FIG. 7 is a flowchart of a method of transferring LEDs, according to one embodiment. The method may be carried out by the controller 316 and/or the processor 410.

A polymer layer is etched 720 between at least one LED and a substrate. This may be etch 314 of the LED and polymer assembly 310, where the LED is any of the LEDs 202, the polymer layer is the polymer layer 204 and the substrate is the carrier substrate 206. A thickness of the polymer layer is monitored 704 during etching of the polymer layer. Monitoring may be via the visual monitor 320 as controlled by the controller 316 and in communication with the plasma chamber 302 via the control signal 318. Etching of the polymer layer is terminated 706 responsive to determining that the thickness of the polymer layer is in a target range or a target value. The thickness of the polymer layer is determined by the visual information provided by the visual monitor 320 and is processed by the controller 316 via any of the processor 410, image processing module 442, thickness detection module 442. Terminating the etch is carried out by the control signal 318 conveyed by the controller 316 to the plasma chamber 302. The target range or the target value may correspond to the thickness of a polymer layer in a polymer ridge structure 502.

A pick-up-tool is brought into contact 708 with at least one surface of the at least one LED facing away from the substrate 210. The pick-up-tool may be the pick-up head array 104 and/or the pick-up head 602. The surface of the at least one LED may be the top surface of the LEDs facing away from the carrier substrate 206. The contact between the at least one surface and the pick-up-tool is shown between the pick-up head 602 and LED 202c in FIG. 6. The PUT is lifted 710 with the at least one LED attached to the PUT. This is shown in FIG. 6 as the pick-up head 602 with LED 202c attached and lifted away from the carrier substrate 206.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
    etching a polymer layer between a substrate and at least one light emitting diode (LED) of a plurality of LEDs, the at least one LED embedded in the polymer layer;
    monitoring a thickness of the polymer layer during etching of the polymer layer; and
    terminating etching of the polymer layer responsive to determining that the thickness of the polymer layer is in a target range or substantially at a target value.

2. The method of claim 1, further comprising:
    bringing a pick-up-tool (PUT) into contact with at least one surface of the at least one LED facing away from the substrate responsive to terminating of the etching; and
    lifting the PUT with the at least one LED attached to the PUT.

3. The method of claim 1, wherein etching the polymer layer comprises dry-etching with oxygen plasma.

4. The method of claim 1, wherein etching the polymer layer comprises dry-etching with air plasma.

5. The method of claim 1, wherein etching the polymer layer comprises isotropic etching.

6. The method of claim 1, monitoring the thickness of the polymer layer comprises:
    capturing an image of the at least one LED and at least a portion of the polymer layer using a microscope.

7. The method of claim 6, wherein the microscope is located outside of a chamber in which the etching of the polymer layer is performed.

8. The method of claim 6, further comprising illuminating the at least one LED and the at least the portion of the polymer layer using light generated by a light source.

9. The method of claim 8, wherein light generated by the light source travels in a direction from the polymer layer to the substrate.

10. The method of claim 8, wherein light generated by the light source travels in a direction from the substrate to the polymer layer.

11. The method of claim 6, wherein the microscope comprises a Scanning Electron Microscope (SEM).

12. The method of claim 1, wherein the target range or the target value of the thickness is greater than a thickness at which delamination of the at least one LED occurs.

13. The method of claim 1, wherein the target range or the target value defines a thickness profile, the thickness profile of the polymer layer forming a ridge structure.

14. The method of claim 1, wherein the at least one LED is a micro LED.

15. The method of claim 1, wherein:
    a plurality of LEDs are embedded in the polymer layer;
    etching further comprises etching the polymer layer between the plurality of LEDs; and
    monitoring further comprises monitoring the thickness of the polymer layer between LEDs in the plurality of LEDs.

16. The method of claim 15, further comprising:
    determining an average thickness of the polymer layer for the plurality of LEDs; and
    terminating etching of the polymer layer responsive to determining that the average thickness is in a target range or substantially at a target value.

17. A non-transitory computer-readable storage medium storing processor executable instructions, the instructions storing instructions, when executed cause a processor to:
    etch a polymer layer between at least one LED and a substrate, the at least one LED embedded in the polymer layer;
    monitor a thickness of the polymer layer during etching of the polymer layer; and
    terminate etching of the polymer layer responsive to determining that the thickness of the polymer layer is in a target range or substantially at a target value.

* * * * *